US012740404B2

(12) United States Patent
Bean

(10) Patent No.: US 12,740,404 B2
(45) Date of Patent: Sep. 15, 2026

(54) MICROELECTRONIC MECHANICAL FUSE AND ANTI-FUSE APPARATUS AND METHOD

(71) Applicant: Rockwell Collins, Inc., Cedar Rapids, IA (US)

(72) Inventor: Reginald D. Bean, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 548 days.

(21) Appl. No.: 18/213,612

(22) Filed: Jun. 23, 2023

(65) Prior Publication Data

US 2024/0429160 A1 Dec. 26, 2024

(51) Int. Cl.
*H10W 20/49* (2026.01)

(52) U.S. Cl.
CPC ................................. *H10W 20/491* (2026.01)

(58) Field of Classification Search
CPC . H01L 23/5252; H01L 23/5256; C06B 45/12; H05K 1/0275
See application file for complete search history.

(56) References Cited

U.S. PATENT DOCUMENTS 3,725,671 A 4/1973 Keister et al.
7,489,013 B1 2/2009 Chubin et al.
7,638,866 B1 12/2009 Bean et al.
8,231,748 B1 7/2012 Higa
9,812,407 B2 11/2017 Ridley et al.
9,816,792 B1 11/2017 Mohler et al.
10,184,761 B2 1/2019 Winter et al.
10,254,090 B1 4/2019 Mohler et al.
(Continued)

FOREIGN PATENT DOCUMENTS

CN 111739850 A 10/2020
CN 112786539 A 5/2021
(Continued)

OTHER PUBLICATIONS

Kleiner, "Introducing SysML WF & IF," Prostep IVIP, Oct. 5, 2021, 25 pages.
(Continued)

*Primary Examiner* — Jeff W Natalini
*Assistant Examiner* — Nicholas Leland Hutson
(74) *Attorney, Agent, or Firm* — Suiter Swantz IP

(57) ABSTRACT

An anti-fuse apparatus for enabling or disabling features associated with one or more integrated circuits (IC) set into a substrate includes a layer of low melting point dielectric material deposited above and/or between two conductive pads set into the substrate and not otherwise electrically coupled. A layer of a low melting point conductive alloy is deposited above the dielectric layer, and a layer of an energetic material deposited above the conductive alloy layer. The energetic material is connected to an ignition circuit for triggering a thermal reaction within the energetic material, removing the dielectric layer and melting the conductive alloy to electrically bridge the conductive pads, enabling or disabling features associated with the ICs (or providing tamper-proof identification strapping) without otherwise fracturing or damaging the underlying substrate or ICs set thereinto.

15 Claims, 6 Drawing Sheets

(56) References Cited

U.S. PATENT DOCUMENTS

| | | | | |
|---|---|---|---|---|
| 11,112,222 | B2 | 9/2021 | Coffey et al. | |
| 2009/0139422 | A1 | 6/2009 | Mohler | |
| 2014/0103286 | A1 * | 4/2014 | Chu | H10B 63/10 438/60 |
| 2016/0013001 | A1 * | 1/2016 | Yoneda | H01H 85/06 337/290 |
| 2017/0245368 | A1 | 8/2017 | Daniels et al. | |
| 2018/0096954 | A1 | 4/2018 | Cabral et al. | |
| 2019/0131612 | A1 * | 5/2019 | Waller | H01M 50/581 |
| 2021/0179280 | A1 * | 6/2021 | Rodriguez | F42B 3/10 |
| 2022/0192012 | A1 | 6/2022 | Schoelen et al. | |
| 2023/0070198 | A1 | 3/2023 | Schremmer et al. | |
| 2025/0079104 | A1 * | 3/2025 | Tsai | H01H 85/055 |

FOREIGN PATENT DOCUMENTS

| | | | |
|---|---|---|---|
| CN | 113838809 | A | 12/2021 |
| WO | 9723122 | A1 | 6/1997 |

OTHER PUBLICATIONS

European Search Report received in EP Application No. 24182396.2, Dec. 6, 2024, 6 pages.

* cited by examiner

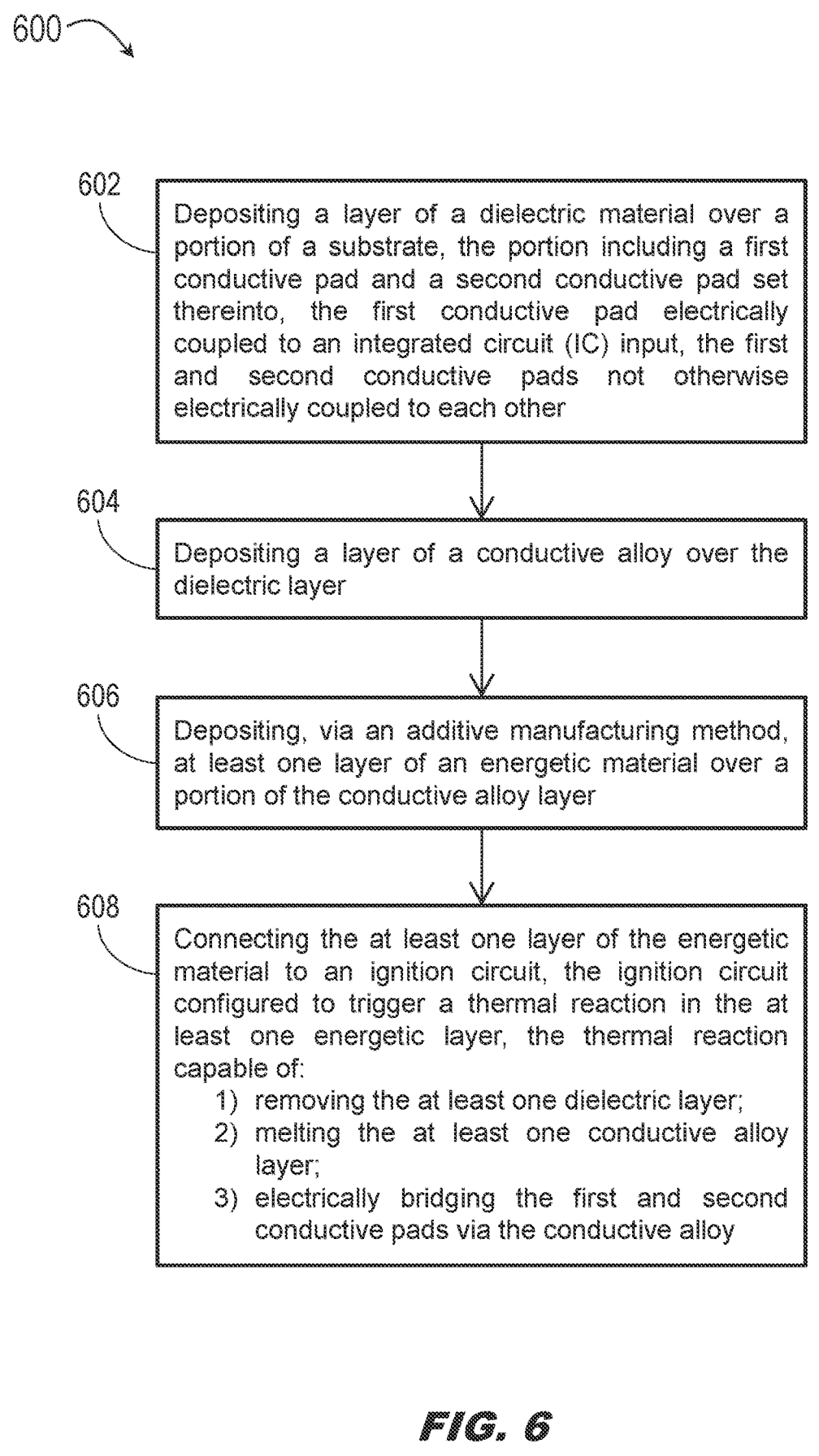

600

602 Depositing a layer of a dielectric material over a portion of a substrate, the portion including a first conductive pad and a second conductive pad set thereinto, the first conductive pad electrically coupled to an integrated circuit (IC) input, the first and second conductive pads not otherwise electrically coupled to each other 604 Depositing a layer of a conductive alloy over the dielectric layer 606 Depositing, via an additive manufacturing method, at least one layer of an energetic material over a portion of the conductive alloy layer 608 Connecting the at least one layer of the energetic material to an ignition circuit, the ignition circuit configured to trigger a thermal reaction in the at least one energetic layer, the thermal reaction capable of:

1) removing the at least one dielectric layer;
2) melting the at least one conductive alloy layer;
3) electrically bridging the first and second conductive pads via the conductive alloy

FIG. 6

MICROELECTRONIC MECHANICAL FUSE AND ANTI-FUSE APPARATUS AND METHOD

BACKGROUND

Leveraging commercial off the shelf (COTS) components often leads to use of third-party components and/or circuit boards that may not have a high degree of trust. For example, it may still be possible to bypass methods for enabling or disabling discrete circuit features based on COTS provided features. Methods for providing identification and feature strapping based on software stored variables (such as in Flash or E-Fuse) may still be reversible or overwritable.

In a microelectronics system in package (SiP), many COTS components may be designed into a single package. In many instances, a single package will be designed with significant versatility to fit multiple use cases. However, with this versatility comes a need to enable or disable selected features, and/or provide methods of unique component identification, not based on COTS components within the package and therefore not vulnerable to trust issues or bypassability as noted above.

SUMMARY

In a first aspect, a microelectronic anti-fuse apparatus is disclosed. In embodiments, the anti-fuse apparatus includes a layer of dielectric material having a low melting point and deposited above a pair of conductive pads (e.g., which are below the dielectric layer but may or may not be under the dielectric layer) set into a substrate. The first pad is electrically coupled to an integrated circuit (IC) input, but the first and second pads are not otherwise initially electrically coupled to each other. A layer of conductive alloy having a low melting point is deposited over the dielectric layer. A layer of energetic material having a higher melting point is deposited over the conductive alloy layer and connected to an ignition circuit. When engaged by a control circuit, the ignition circuit triggers a thermal reaction in the energetic layer. The thermal reaction melts the dielectric and conductive alloy layers without otherwise damaging the underlying substrate, removing the dielectric layer and allowing the conductive alloy layer to electrically bridge the two conductive pads.

In some embodiments, the second conductive pad (e.g., the conductive pad not coupled to the IC input) is electrically coupled to ground, and the thermal reaction grounds the IC input by electrically bridging the two conductive pads.

In some embodiments, the second conductive pad (e.g., the conductive pad not coupled to the IC input) is electrically coupled to ground, the IC input is electrically interfaced with an output of another IC via the first conductive pad, and the thermal reaction disables the interface by bridging the two conductive pads and grounding the IC output.

In some embodiments, the second conductive pad is also connected to a (second) IC (the IC input being associated with a first IC) and the thermal reaction enables input/output (I/O) between the first and second ICs, enabling access to features associated with the second IC by bridging the two conductive pads and therefore electrically bridging the first and second ICs.

In some embodiments, the dielectric layer is deposited via aerosol jet printing, inkjet printing, or screenprinting.

In some embodiments, the dielectric layer is deposited between the conductive pads, e.g., over conductive leads between the conductive pads but not over the conductive pads themselves.

In some embodiments, the dielectric layer is deposited directly over the conductive pads.

In a first aspect, a microelectronic anti-fuse apparatus is disclosed. In embodiments, the anti-fuse apparatus includes a layer of dielectric material having a low melting point and deposited above a pair of conductive pads (e.g., which are below the dielectric layer but may or may not be under the dielectric layer) set into a substrate. The first pad is electrically coupled to an integrated circuit (IC) input, but the first and second pads are not otherwise initially electrically coupled to each other. A layer of energetic material is deposited over the dielectric layer and connected to an ignition circuit. A layer of conductive alloy having a low melting point is deposited over the energetic layer. When engaged by a control circuit, the ignition circuit triggers a thermal reaction in the energetic layer. The thermal reaction melts the dielectric and conductive alloy layers without otherwise damaging the underlying substrate, removing the dielectric and energetic layers and allowing the conductive alloy layer to electrically bridge the two conductive pads.

In some embodiments, the second conductive pad (e.g., the conductive pad not coupled to the IC input) is electrically coupled to ground, and the thermal reaction grounds the IC input by electrically bridging the two conductive pads.

In some embodiments, the second conductive pad (e.g., the conductive pad not coupled to the IC input) is electrically coupled to ground, the IC input is electrically interfaced with an output of another IC via the first conductive pad, and the thermal reaction disables the interface by bridging the two conductive pads and grounding the IC output.

In some embodiments, the second conductive pad is also connected to a (second) IC (the IC input being associated with a first IC) and the thermal reaction enables input/output (I/O) between the first and second ICs, enabling access to features associated with the second IC by bridging the two conductive pads and therefore electrically bridging the first and second ICs.

In some embodiments, the dielectric layer is deposited via aerosol jet printing, inkjet printing, or screenprinting.

In some embodiments, the dielectric layer is deposited between the conductive pads, e.g., over conductive leads between the conductive pads but not over the conductive pads themselves.

In some embodiments, the dielectric layer is deposited directly over the conductive pads.

In a still further aspect, a method for forming an anti-fuse apparatus on a substrate is also disclosed. In embodiments, the method includes depositing a layer of a dielectric material having a low melting point over a portion of a substrate, between (and, in some embodiments, directly over) a first conductive pad and a second conductive pad set into the substrate. The first conductive pad is electrically coupled to an integrated circuit (IC) input, but the first and second conductive pads are not otherwise electrically coupled to each other. The method includes depositing a layer of a low-melting-point conductive alloy over the dielectric layer. The method includes depositing an energetic material over some or all of the conductive alloy layer. The method includes connecting the energetic material to an ignition circuit capable of triggering a thermal reaction in the energetic material. The thermal reaction is capable of melting and removing the dielectric layer and melting the conductive alloy layer, allowing the conductive alloy layer to electrically bridge the conductive pads while avoiding generating sufficient heat or energy to otherwise damage the underlying substrate.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

and FIG. 6 is a flow diagram illustrating a method for forming an anti-fuse apparatus according to example embodiments of this disclosure.

DETAILED DESCRIPTION

Figure 1:
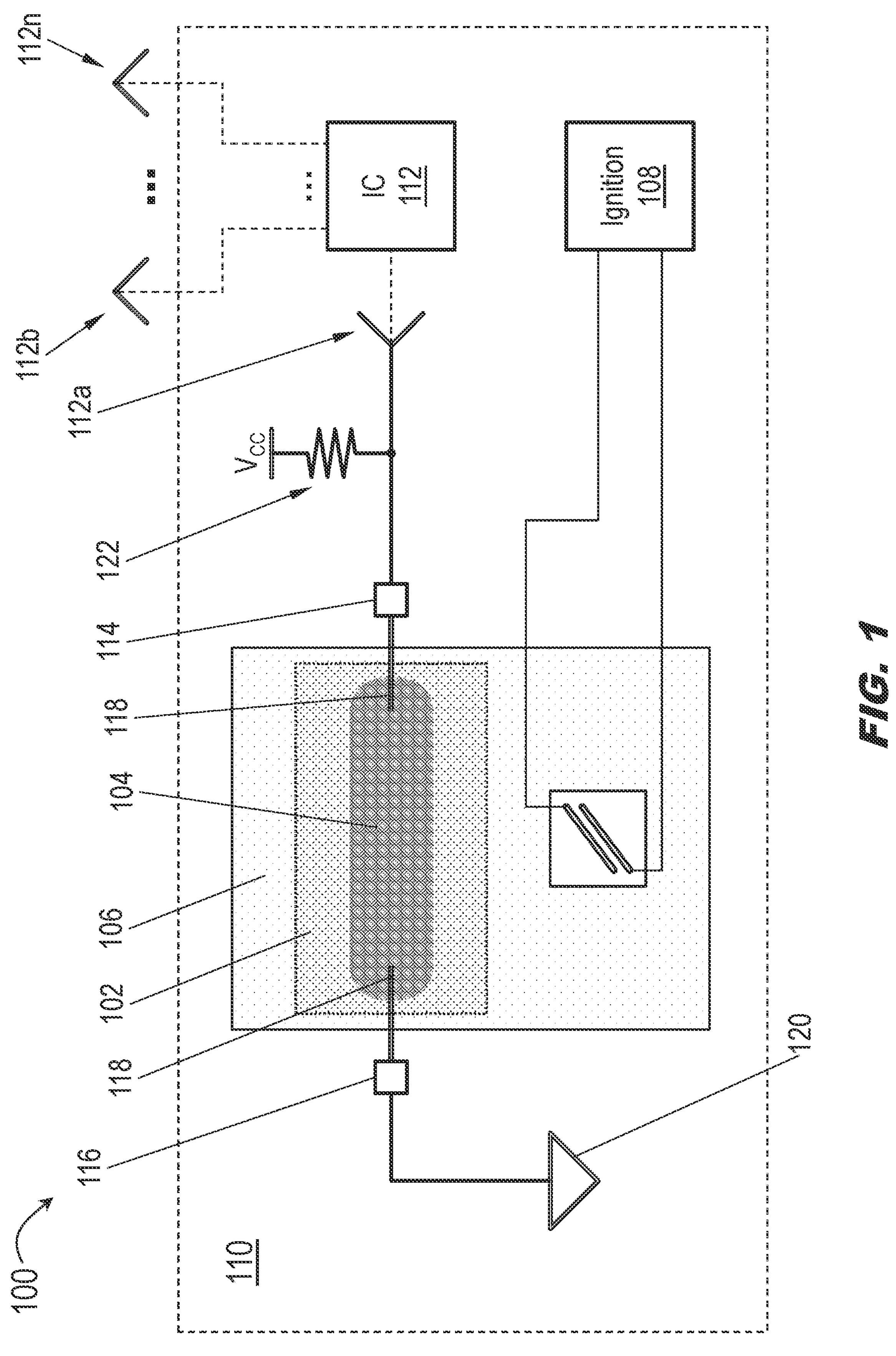
FIG. 1 is a diagrammatic illustration of an anti-fuse apparatus for identification strapping of an integrated circuit (IC) according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to apparatus and methods for leveraging energetic materials on a microelectronic scale to create fuse and anti-fuse apparatus for the modification of identification (ID) strapping, fault flags, and/or circuit interconnectivity on a mechanical, irreversible basis. Accordingly, ID strapping and feature modification can be implemented on COTS components without the trust issues or vulnerabilities of said COTS components.

Referring now to FIG. 1, a microelectronic anti-fuse apparatus 100 is shown. The anti-fuse apparatus 100 may include a dielectric layer 102, conductive alloy layer 104, energetic layer 106, ignition circuit 108, and substrate 110.

In embodiments, one or more components of the anti-fuse apparatus 100 may be attached to a substrate 110 via additive manufacturing methods. For example, the substrate 110 may include a system in package (SiP), bare die, circuit board, microelectronic device, backplane connector, Ethernet physical layer (PHY) device, electronic device, and/or mobile cellular/WiFi antenna. In embodiments, one or more integrated circuits 112 (IC) may likewise be attached to the substrate 110.

In embodiments, the dielectric layer 102, e.g., one or more layers of dielectric material having a low melting point, may be similarly deposited over a portion of the substrate 110. For example, the dielectric layer 102 may include ultraviolet-cure epoxy resins (e.g., MasterBond UV15, Loctite EA3335), polyimides, or any other appropriate dielectric deposited over high melting point conductive metal pads 114, 116 (e.g., or electric leads 118 electrically coupled to said conductive pads) which in turn may be positioned over a portion of the substrate 110. With respect to the dielectric layer 102 and the conductive alloy layer 104, the incorporation of relatively lower-melting-point components requires less thermal energy to melt, and therefore minimizes the risk of damage to, or destruction of, the underlying substrate 110 as a result of the thermal reaction.

In embodiments, the dielectric layer 102 may be deposited over the substrate 110 between two conductive pads

114, 116 having a high melting point (e.g., copper) and not otherwise electrically coupled to each other. For example, one conductive pad 114 may be electrically coupled to an input of the IC 112 and/or a power supply (e.g., common collector voltage Vcc). Further, the other conductive pad 116 may be electrically coupled to a ground 120. In embodiments, the dielectric layer 102 may be deposited over the substrate 110 (e.g., over a portion thereof) such that electric leads 118 between the conductive pads 114, 116 are insulated from the conductive alloy layer 104 by the dielectric layer 102. In some embodiments, the conductive pads 114, 116 may be disposed directly beneath the dielectric layer 102, the conductive alloy 104, and the energetic layer 106, e.g., the said layers are deposited directly over the conductive pads (e.g., in which case the electric leads 118 are not needed).

In embodiments, the conductive alloy layer 104 may comprise a quantity of metal alloy having a low melting point (e.g., lower than that of the energetic layer 106). For example, the conductive alloy layer may likewise be deposited over the electric leads 118 but insulated therefrom by the dielectric layer 102. In embodiments, the conductive alloy layer 104 may include, but is not limited to, tin (Sn) or any of the following alloys: tin/lead (SnPb), bismuth/tin (BiSn), bismuth/tin/silver (BiSnAg), tin/indium/silver (SnInAg). Further, the conductive alloy layer 104 may be deposited via one or more methods including, but not limited to, alloy paste screening, preshaping (e.g., into a resistor shape) and pick-and-place deposition, placement by hand, and/or any other appropriate method capable of depositing the conductive alloy layer 104 without disturbing or damaging the underlying dielectric layer 102.

In embodiments, the energetic layer 106 may be deposited over the conductive alloy layer 104 according to any appropriate deposition methods (e.g., controlled direct-write (e.g., inkjet printing, liquid deposition, extrusion), aerosol jet printing, fused-filament fabrication) capable of providing precise control for the feature size of the energetic layer. Further, the energetic layer 106 may include one or more nanothermite, pyrotechnic, or explosive compounds as disclosed in U.S. patent application Ser. No. 17/120,574 and incorporated by reference herein in their entirety, but not sufficiently thickly or densely applied as to be capable of causing a pyrotechnic or explosive reaction damaging to (or destructive to) the substrate 110. In some embodiments, the conductive alloy layer 104 may be deposited above the energetic layer 106. For example, in some cases the energetic layer 106 may have a lower melting point, such that the thermal reaction triggered by the ignition circuit melts and removes the energetic layer as well as the dielectric layer, leaving the melted conductive alloy layer 104 to bridge the conductive pads.

In embodiments, the energetic layer 106 may be connected to an ignition circuit 108, which likewise may be attached to the substrate 110. For example, the ignition circuit 108 (e.g., on engagement or initiation by a control circuit) may trigger a thermal reaction with respect to the energetic layer 106, providing sufficient heat as to melt both the dielectric layer 102 and the conductive alloy layer 104, removing the dielectric layer and allowing the melted conductive alloy layer to complete an electrical bridge between the underlying conductive pads 114, 116 (e.g., thus connecting the IC 112 and the ground 120). However, the thermal reaction triggered by the ignition circuit 108 may be limited to a small footprint including the dielectric layer 102 and conductive alloy layer 104, so as not to fracture or otherwise damage the substrate 110.

In embodiments, the IC 112 may be identification (ID) strapped in order to uniquely identify the IC among a set of many such otherwise identical ICs. For example, the IC 112 may be associated with an Ethernet device having a media access control (MAC) address (e.g., a 48-bit, 12-digit hexadecimal) or like unique identifier. In embodiments, the IC 112 may be "marked" with the corresponding MAC address in a mechanical and permanent way that does not leave the substrate or IC open to tampering or to exploitation of vulnerabilities associated with COTS components, and that does not otherwise damage the substrate. For example, the IC 112 may have a series of discrete hardwired input interfaces 112*a*-112*n*, e.g., 48 interfaces, each input interface capable of a shorted state or an open (e.g., grounded) state readable by a digital circuit interface as either a logical one or a logical zero respectively. In embodiments, each of the interfaces 112*a*-112*n* to the IC 112 may be associated with a default state wherein the conductive pads 114, 116 are not electrically coupled and the resistor 122 pulls the line high, such that the state of the interface may be interpreted as a logical-one. In embodiments, the ignition circuits 108 for selected interfaces 112*a*-112*n* may be engaged by a control circuit (not shown) to selectively trigger the thermal reaction in their respective energetic layers 106, removing their respective dielectric layers 102 and melting their respective conductive alloy layers 104 to electrically bridge the conductive pads 114, 116 and connecting the respective interface to ground 120. For example, each of the resulting grounded interfaces distributed within 112*a*-112*n* may be interpreted as a logical-zero, while each of the untriggered interfaces distributed within 112*a*-112*n* may be interpreted as a logical-one, and the full set of interfaces may represent the 48-bit MAC address.

Figure 2:
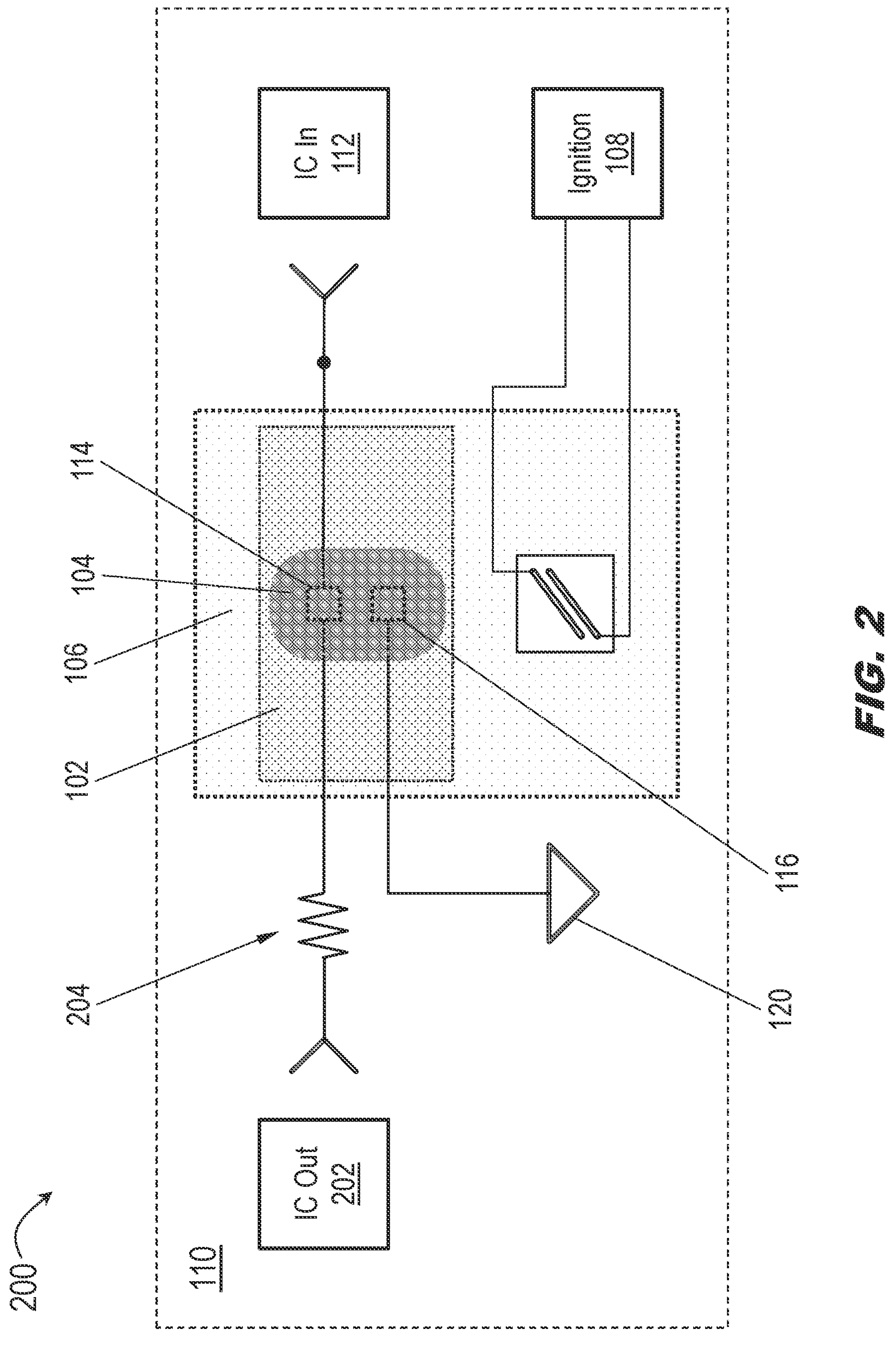
FIG. 2 is a diagrammatic illustration of an anti-fuse apparatus for disabling of additional IC features according to example embodiments of this disclosure.

Referring now to FIG. 2, the anti-fuse apparatus 200 may be implemented and may function similarly to the anti-fuse apparatus 100 of FIG. 1, except that the anti-fuse apparatus 200 may be engaged to disable additional features with respect to the substrate 110 and/or component ICs 112, 202.

In embodiments, the substrate 110 may include an IC output 202 electrically coupled to an input of the IC 112 via the conductive pad 114. For example, the ignition circuit 108 may be engaged (e.g., via control circuit, not shown) to trigger a thermal reaction with respect to the energetic layer 106, melt and remove the dielectric layer 102, and melt the conductive alloy layer 104 so as to disable the electrical coupling between the ICs 112 and 202 by shorting the interface between the two ICs to ground 120. Further, the melted conductive alloy layer 104 may form an electrical bridge between the conductive pads 114 and 116, grounding the interface. Current through the interface may be limited by the resistor 204 on the output of the IC 202, preventing damage to the IC due to the grounding.

Figure 3:
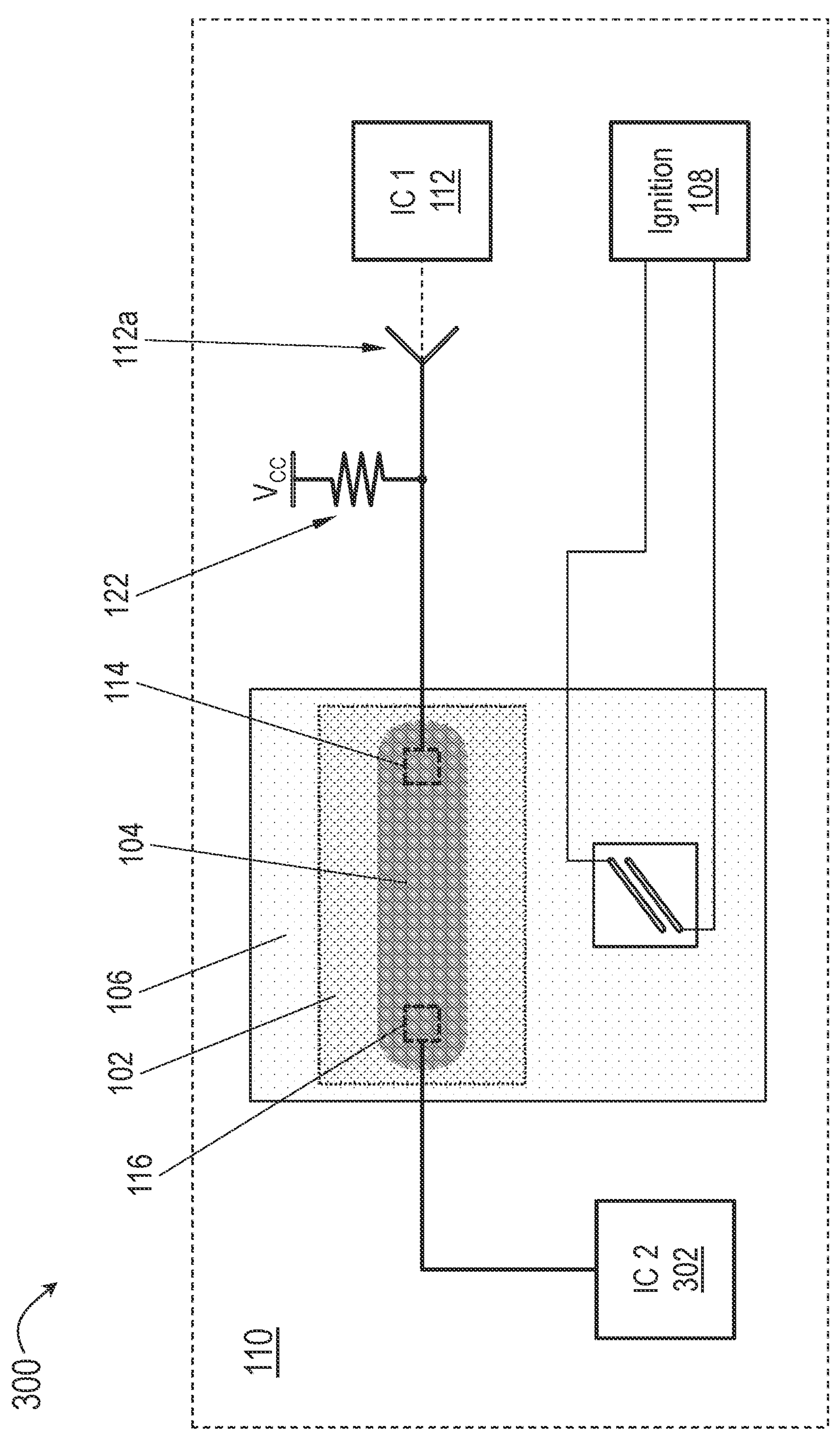
FIG. 3 is a diagrammatic illustration of an anti-fuse apparatus for enabling of additional IC features according to example embodiments of this disclosure.

Referring now to FIG. 3 the anti-fuse apparatus 300 may be implemented and may function similarly to the anti-fuse apparatus 100 of FIG. 1, except that the anti-fuse apparatus 300 may be engaged to enable additional features with respect to the substrate 110 and/or component ICs 112, 302.

In embodiments, and as described above with respect to the anti-fuse apparatus of FIG. 1, the ignition circuit 108 may be engaged (e.g., via control panel, not shown) to trigger a thermal reaction within the energetic layer 106, removing the dielectric layer 102, melting the conductive alloy layer 104, and bridging the conductive pads 114, 116 via the conductive alloy. For example, the electrical bridge between the conductive pads 114, 116 may enable input/output (I/O) between the IC 112 and the IC 302, enabling access to features associated with the IC 302. It may be noted that with respect to the anti-fuse apparatus 300 (and as noted above with respect to the anti-fuse apparatus of FIG. 1), the conductive pads 114, 116 may be disposed directly beneath the conductive alloy layer 104.

Figure 4:
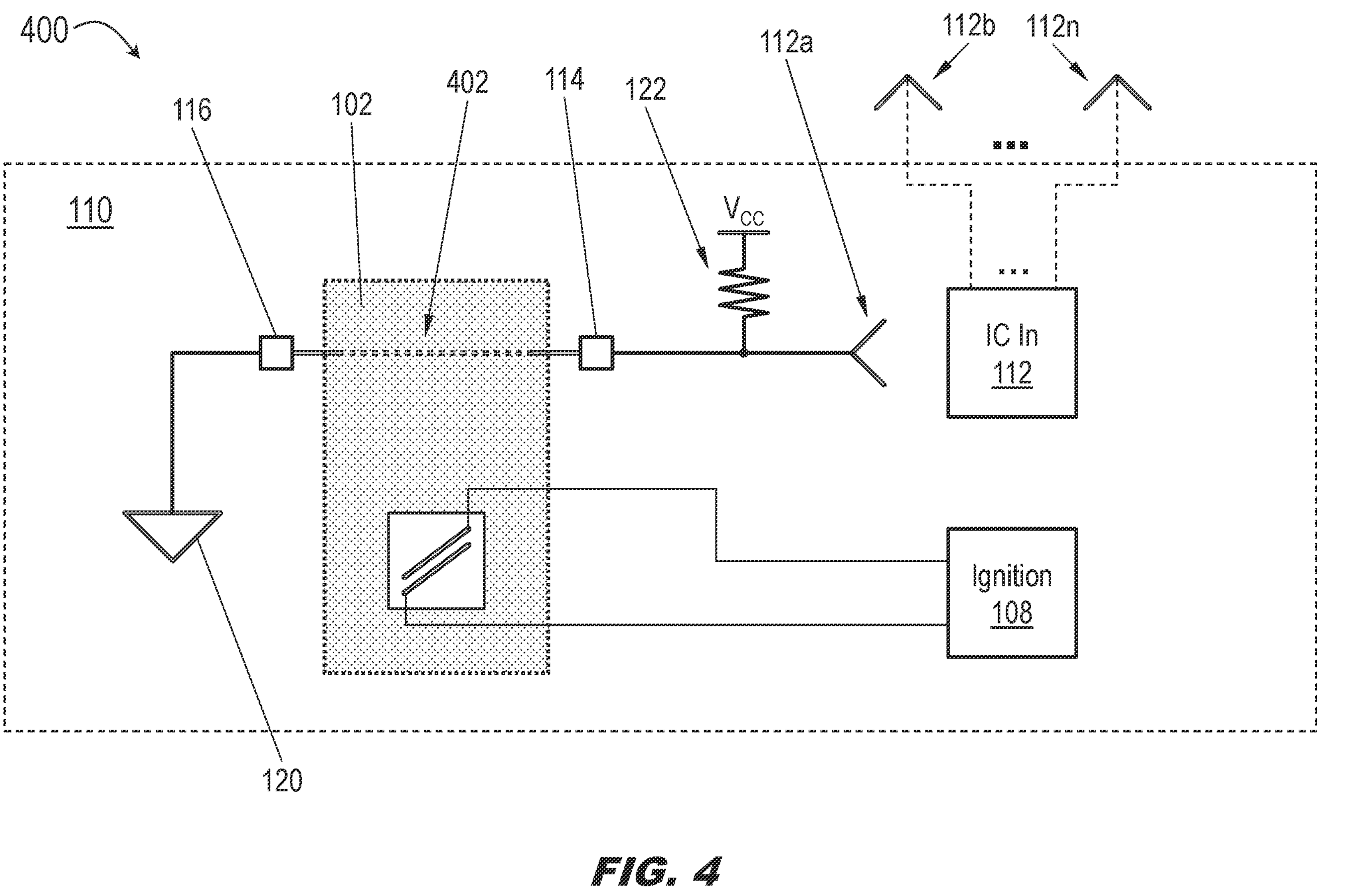
FIG. 4 is a diagrammatic illustration of a fuse apparatus for identification strapping of an IC according to example embodiments of this disclosure.

Referring now to FIG. 4, a fuse apparatus 400 is shown. Commonly owned U.S. patent application Ser. No. 17/120,574, which is incorporated herein by reference in its entirety, discloses an anti-tamper architecture based on the addition of energetic materials to a COTS device. However, said anti-temper architecture involves the use of pyrotechnic and/or explosive compounds to permanently fracture or destroy the device via exothermic reaction.

In embodiments, the fuse apparatus 400 may include an energetic layer 106 and ignition circuit 108 that may be implemented and may function similarly to the anti-fuse apparatus 100, 200 of FIGS. 1 and 2. In particular, similarly to the anti-fuse apparatus 100, the fuse apparatus 300 may be engaged to modify one or more input interfaces 112*a*-112-*n* to the IC 112 for identification strapping purposes. For example, each of the interfaces 112*a*-112*n* may be associated with a default state wherein the conductive pads 114, 116 are electrically bridged by a closed circuit 402, such that each input may be readable or detectable as a logical-zero.

In embodiments, with respect to the fuse apparatus 400, the energetic layer 106 may be deposited over the closed circuit 402. For example, the energetic layer 106 may be deposited via any additive manufacturing process elsewhere disclosed herein allowing for precise control over the surface area and/or thickness of the energetic layer. In embodiments, the ignition circuit 108 may be engaged (e.g., via a control circuit) to trigger a thermal reaction within the energetic layer 106. For example, the thermal reaction may not generate sufficient heat to fracture or otherwise damage the substrate 110 (e.g., as opposed to a pyrotechnic or explosive reaction), but may render the material of the closed circuit 402 highly resistive, modifying the closed circuit to an open circuit for identification strapping purposes: e.g., any interface 112*a*-112*n* so modified may subsequently be readable or detectable as a logical-one rather than a logical-zero (e.g., the disconnected line pulled high by the resistor 122), such that the set of interfaces 112*a*-112*n* may collectively mechanically encode an n-bit binary identifier, e.g., a 48-bit unique MAC address.

Figure 5:
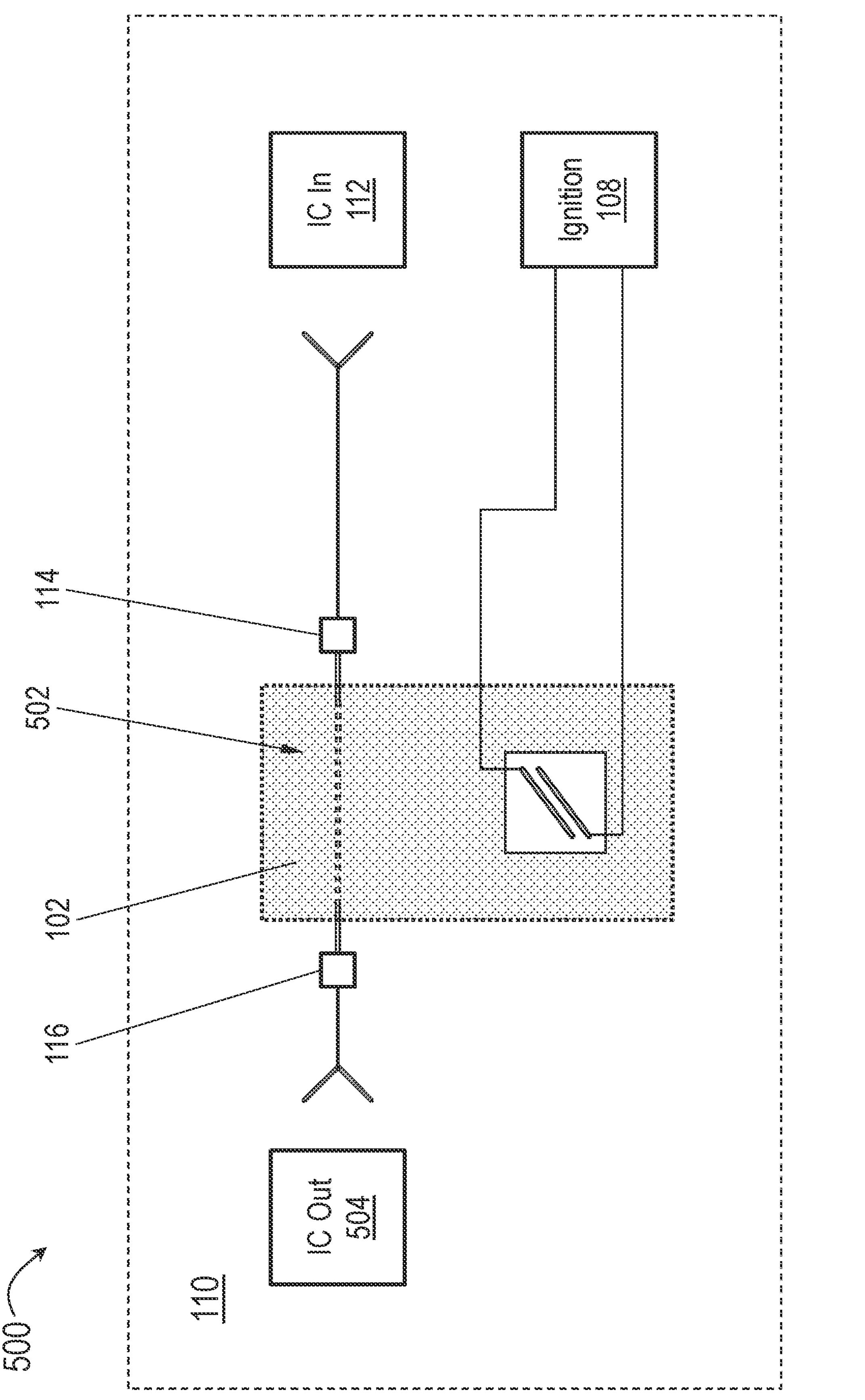
FIG. 5 is a diagrammatic illustration of a fuse apparatus for disabling IC features according to example embodiments of this disclosure.

Referring now to FIG. 5, the fuse apparatus 500 may be implemented and may function similarly to the fuse apparatus 400, except that the energetic layer 106 of the fuse apparatus 500 may be deposited over an electric bridge 502 connecting the input of a first IC 112 and the output of a second IC 504 (e.g., via the conductive pads 114, 116 respectively). In embodiments, the ignition circuit 108 may be engaged (e.g., via a control circuit, not shown) to trigger a thermal reaction within the energetic layer 106 and render the electric bridge 502 highly resistive, disabling the connection between the output IC 504 and the input IC 112 and likewise disabling any features associated with the input IC 112.

Referring now to FIG. 6, the method 600 may be implemented by the anti-fuse apparatus 100, 200 and may include the following steps.

At a step 602, a layer of low melting point dielectric material is deposited over a portion of a circuit board or other like substrate. For example, the dielectric may be deposited between a pair of conductive pads set into the substrate, one conductive pad connected to an integrated circuit (IC) input and the two conductive pads not otherwise electrically connected. In some embodiments, the second conductive pad is electrically coupled to a logical ground. In other embodiments, the second conductive pad is electrically coupled to the output of another integrated circuit (e.g., such that the output of the second IC feeds into the input of the first IC).

At a step 604, a layer of a low melting point conductive alloy is deposited over the dielectric layer when constructing the anti-fuse.

At a step 606, a layer of energetic material is deposited over a portion of the conductive alloy layer. In some embodiments, the energetic material may be deposited first, and the conductive alloy layer deposited over the energetic material. For example, the energetic material may be deposited via aerosol jet printing or any like appropriate additive method providing precise control of footprint size and/or thickness.

At a step 608, the energetic material is connected to an ignition circuit (e.g., which may be triggered or engaged by a control circuit, the ignition circuit and control circuit likewise set into the substrate). For example, when triggered by the control circuit, the ignition circuit triggers a thermal reaction in the energetic material. The heat generated melts and removes the dielectric layer, and similarly melts the conductive alloy layer such that the conductive alloy forms an electrical bridge connecting the two conductive pads. In some embodiments, e.g., the conductive alloy layer may electrically bridge a conductive pad connecting two ICs (e.g., a second IC output to a first IC input) with another conductive pad electrically coupled to ground, grounding the output IC and disabling the interface between the two ICs. In some embodiments, the conductive alloy layer may electrically bridge one or more ICs' inputs to one or more IC outputs, enabling I/O between the bridged ICs and enabling access to additional features associated with newly bridged ICs.

CONCLUSION

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. An apparatus, comprising:

at least one layer of a dielectric material deposited above a first and a second conductive pad set into a substrate, the first conductive pad electrically coupled to an integrated circuit (IC) input, the first and second conductive pads not otherwise electrically coupled to each other;

at least one layer of a conductive alloy deposited above the dielectric layer;

and at least one layer of an energetic material deposited above the conductive alloy layer, the energetic material coupled to an ignition circuit;

wherein the ignition circuit is configured to trigger a thermal reaction in the energetic material, the thermal reaction generating a thermal energy causing:

1) At least one of melting and removing the at least one dielectric layer;

2) Melting the at least one conductive alloy layer; and

3) Electrically bridging the first and second conductive pads via the conductive alloy layer;

and wherein the thermal energy generated by the thermal reaction is insufficient to damage the substrate.

2. The apparatus of claim 1, wherein:

the second conductive pad is electrically coupled to a ground;

and the thermal reaction is configured to ground the IC input by electrically bridging the first and second conductive pads.

3. The apparatus of claim 1, wherein:

the second conductive pad is electrically coupled to a ground;

the IC input is electrically coupled to at least one second IC output via the first conductive pad;

and the thermal reaction is capable of 1) disabling the electrical coupling of the IC input and the IC output by grounding the at least one second IC output.

4. The apparatus of claim 1, wherein:

the IC input is associated with a first IC;

the second conductive pad is electrically coupled to a second IC;

and the electrical bridge between the first and second ICs is capable of enabling input/output (I/O) between the first and second ICs.

5. The apparatus of claim 1, wherein the at least one dielectric layer is deposited via at least one of aerosol jet printing, inkjet printing, or screen printing.

6. The apparatus of claim 1, wherein the at least one dielectric layer is deposited between the first and the second conductive pads.

7. The apparatus of claim 1, wherein the at least one dielectric layer is deposited over the first and the second conductive pads.

8. An apparatus, comprising:

a first conductive pad and a second conductive pad set into a substrate, the first conductive pad electrically coupled to an integrated circuit (IC) input, the first and second conductive pads not otherwise electrically coupled to each other;

at least one layer of a dielectric material deposited above the first and second conductive pads;

at least one layer of an energetic material deposited above the dielectric layer, the energetic material coupled to an ignition circuit;

and at least one layer of a conductive alloy deposited above the energetic layer;

wherein the ignition circuit is configured to trigger a thermal reaction in the energetic material, the thermal reaction generating a thermal energy causing:

1) At least one of melting and removing the at least one dielectric layer and the at least one energetic layer;

2) Melting the at least one conductive alloy layer; and

3) Electrically bridging the first and second conductive pads via the conductive alloy layer;

and wherein the thermal energy generated by the thermal reaction is insufficient to damage the substrate.

9. The apparatus of claim 8, wherein:

the second conductive pad is electrically coupled to a ground;

and the thermal reaction is configured to ground the IC input by electrically bridging the first and second conductive pads.

10. The apparatus of claim 8, wherein:

the second conductive pad is electrically coupled to a ground;

the IC input is electrically coupled to at least one second IC output via the first conductive pad;

and the thermal reaction is capable of 1) disabling the electrical coupling of the IC input and the IC output by grounding the at least one second IC output.

11. The apparatus of claim 8, wherein:

the IC input is associated with a first IC;

the second conductive pad is electrically coupled to a second IC;

and the electrical bridge between the first and second ICs is capable of enabling input/output (I/O) between the first and second ICs.

12. The apparatus of claim 8, wherein the at least one dielectric layer is deposited via at least one of aerosol jet printing, inkjet printing, or screen printing.

13. The apparatus of claim 8, wherein the at least one dielectric layer is deposited between the first and the second conductive pads.

14. The apparatus of claim 8, wherein the at least one dielectric layer is deposited over the first and the second conductive pads.

15. A method for forming an anti-fuse on an apparatus, the method comprising:

depositing a layer of a dielectric material over a portion of a substrate, the portion including a first conductive pad and a second conductive pad set thereinto, the first conductive pad electrically coupled to an integrated circuit (IC) input, the first and second conductive pads not otherwise electrically coupled to each other;

depositing a layer of a conductive alloy over the dielectric layer;

depositing, via an additive manufacturing method, at least one layer of an energetic material over a portion of the conductive alloy layer;

connecting the at least one layer of the energetic material to an ignition circuit, the ignition circuit configured to trigger a thermal reaction in the at least one energetic layer, the thermal reaction generating a thermal energy causing:

1) At least one of melting and removing the at least one dielectric layer;

2) Melting the at least one conductive alloy layer; and

3) Electrically bridging the first and second conductive pads via the conductive alloy layer:

and wherein the thermal energy generated by the thermal reaction is insufficient to damage the substrate.

* * * * *